May 17, 1960 L. R. HARPER 2,937,291

SINGLE SHOT BISTABLE CIRCUIT

Filed Dec. 31, 1957

INVENTOR.
L. R. HARPER

BY Lester H. Clark

ATTORNEY

United States Patent Office 2,937,291

Patented May 17, 1960

2,937,291

SINGLE SHOT BISTABLE CIRCUIT

Leonard Roy Harper, Poughkeepsie, N.Y., assignor to International Business Machines Corporation, New York, N.Y., a corporation of New York Application December 31, 1957, Serial No. 706,524

8 Claims. (Cl. 307—88.5)

This invention relates to single shot bistable circuits employing transistors.

A single shot bistable circuit may be defined as one which receives an input pulse, preferably a sharply peaked pulse and produces a square wave output pulse of a fixed duration which is determined by the characteristics of the circuit.

An object of the invention is to produce a circuit of the type described having low output impedance.

A further object is to provide a circuit of the type described which is capable of driving a large number of parallel connected loads, which loads may be the driving inputs of the trigger circuits disclosed in my copending application, Serial No. 706,486, filed December 31, 1957.

A further object is to provide a circuit of the type described which requires little or no standby current when the circuit is Off.

A further object is to provide a single shot bistable circuit having a short output rise time.

Another object is to provide a circuit of the type described in which the output potential is constant and the output duration is constant, regardless of the variations in the characteristics of the transistors with time.

The foregoing objects of the invention are attained in the circuits described herein. Each of these circuits includes two transistors having complementary symmetry. In the circuits shown, the input is connected to an NPN junction transistor and the output is derived from a PNP junction transistor. The collector of the NPN transistor is directly conductively coupled to the base of the PNP transistor. The emitters of the two transistors are coupled through a resistor and a capacitor in series. Both transistors are biased Off. When both transistors are Off, the capacitor is charged through a circuit provided for that purpose. An input signal applied to the base of the NPN transistor turns it On and acts through the coupling between the transistors to turn the PNP transistor On also. The two transistors then provide a discharge circuit for the capacitor. As long as the capacitor is discharging, the transistors remain On. The length of time of the On period is determined by the time constant of the capacitor discharging circuit.

An output circuit is connected to the collector of the PNP transistor. This output circuit includes a load impedance which balances another impedance connected between the emitter and ground. The external load applied across this load impedance affects the division of voltage across the impedances in such a way as to increase the discharge current from the capacitor in proportion to the size of the external load. Consequently, the capacitive external load is counterbalanced by the voltage divider action, and the duration and potential of the output pulse is substantially constant over a wide range of capacitive loads.

Other objects and advantages of the invention will become apparent from a consideration of the following specification and claims, taken together with the accompanying drawing.

FIG. 1

Figure 1:
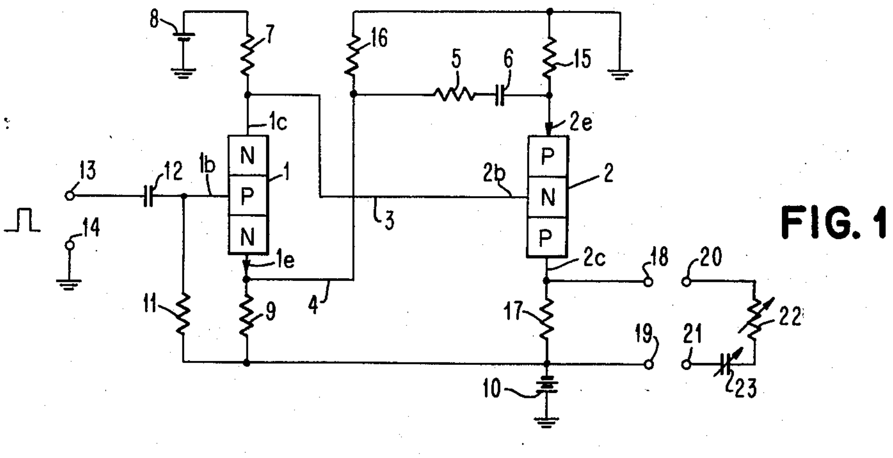
Fig. 1 is a wiring diagram of one form of single shot trigger circuit embodying the invention.

This figure illustrates a circuit including an NPN junction transistor 1 and a PNP junction transistor 2. Each transistor is provided with an emitter electrode identified by the reference numeral of the transistor with the letter *e* added, a base electrode identified by the reference numeral of the transistor with the letter *b* added, and a collector electrode identified by the reference numeral of the transistor with the letter *c* added.

The collector **1*c* is directly conductively coupled to the base 2*b* through a wire 3. Emitter 1*e* is coupled to the emitter 2*e* through a wire 4, a resistor 5, and a capacitor 6. Collector 1*c* is connected through a resistor 7 and a battery 8 to ground. Emitter 1*e* is connected through a resistor 9 and a battery 10 to ground. A resistor 11 is connected between the base 1*b* and the ungrounded terminal of the battery 10. Base 1*b* is connected through an input capacitor 12 to an input terminal 13, which cooperates with a grounded input terminal 14**.

Emitter **2*e* is connected through a resistor 15 to ground. A resistor 16 connects the wire 4 to ground. Collector 2*c* is connected through a load resistor 17 and battery 10 to ground. Output terminals 18 and 19 are connected to the opposite terminals of resistor 17. The terminals 18 and 19 are adapted to be connected to an external load through terminals 20 and 21. The external load is diagrammatically represented in Fig. 1 by a variable resistor 22 connected in series with a variable capacitor 3**.

There are shown in the following table certain values of battery potentials and of impedances which were employed in one circuit constructed in accordance with the invention. These values are given by way of example only, and it is to be understood that the invention is not limited to them or any of them:

*Table*

| | | |
|---|---|---|
| Resistor 5 | ohms | 47 |
| Capacitor 6 | pfd | 1.5K |
| Resistor 7 | ohms | 4700 |
| Battery 8 | volts | 3 |
| Resistor 9 | ohms | 1200 |
| Battery 10 | volts | 6 |
| Resistor 11 | ohms | 4700 |
| Capacitor 12 | pfd | 470 |
| Resistor 15 | ohms | 91 |
| Resistor 16 | do | 10,000 |
| Resistor 17 | do | 91 |

OPERATION OF FIG. 1

In the absence of an input signal, both the NPN transistor 1 and the PNP transistor 2 are off. Note that the emitter **1*e* is biased positively with respect to base 1*b* through the cooperation of resistors 9, 16 and 11, so that the transistor 1 is cut off. In the case of transistor 2, the battery 8 reversely biases the base emitter impedance through resistor 7**, so that that transistor is held cut off.

When both transistors are Off, the capacitor 6 charges through a circuit which may be traced from ground through resistor 15, capacitor 6, resistor 5, wire 4, resistor 9 and battery 10 to ground.

After the capacitor 6 is charged, if a positive input signal is received at the terminal 13, it passes through capacitor 12 and swings the base **1*b*** momentarily positive with respect to emitter 1*e*. This turns the transistor 1 On, producing a current flow from battery 8 through resistor 7 and the collector-base impedance of transistor 1. This current flow produces a potential drop across resistor 7, thereby causing the potential at collector 1*c* to swing negatively. This negative swing is transmitted through wire 4 to base 2*b* where it is effective to forwardly bias the base emitter impedance of transistor 2, turning that transistor On. Current then flows from battery 10 through resistor 17, the collector-emitter impedance of transistor 2, resistor 15 and back through ground to battery 10. This current produces voltage drops across resistor 15 and resistor 17. In the absence of an external load across resistor 17, these two potential drops tend to be equal, since the resistors are equal. The operation of the circuit will first be described without any external load. This current flow swings the emitter 2*e* negative with respect to ground, and swings the collector 2*c* in a positive sense.

The two transistors 1 and 2 now complete a discharge circuit for the capacitor 6. This circuit may be traced from the right-hand terminal of capacitor 6 to emitter 2*e*, base 2*b*, wire 3, collector 1*c*, emitter 1*e*, wire 4 and resistor 5 to the opposite terminal of capacitor 6. The current due to the discharge of the capacitor supplies the base current for the transistor 2, and maintains the transistor 2 On, as long as the capacitor discharge current continues to flow. Resistors 7 and 16 are also effective in parallel branches of the network by which capacitor 6 is discharged. The duration of this discharge current is determined primarily by the resistor 7. Note that both transistors at this time present low impedances to this current and hence variations in their characteristics have little or no effect on duration of the capacitor discharge current. When the capacitor is discharged, the potential at emitter 1*e* rises again, removing the forward bias on the base-emitter impedance of transistor 1, and turning it Off. When transistor 1 turns Off, the potential of collector 1*c* rises toward that of the positive terminal of battery 8, thereby reversely biasing the base-emitter impedance of transistor 2, and turning that transistor Off. The capacitor 6 is then charged again through the circuit previously traced.

Consider now the operation of the circuit of Fig. 1 when a substantial load impedance is connected across the output terminals 18 and 19. This circuit is designed for use with highly capacitive loads. The external load is illustrated in Fig. 1 by a variable resistor 22 and a variable capacitor 23.

When the transistor 2 turns On, if there is a heavy external load, the transient impedance between collector 2*c* and battery 10 is considerably lower than the impedance between the emitter 2*e* and ground, so that most of the potential of battery 10 appears across the resistor 15, between emitter 2*e* and ground. The right-hand terminal of capacitor 6 is thereby swung considerably more negatively than is the case when there is no external load, so that there is a larger discharge current from capacitor 6 through the emitter of transistor 2. Consequently, there is a correspondingly larger output current through collector 2*c* to supply the larger external load. Furthermore, the more negative voltage on the emitter 2*e* has the effect of swinging the transistor 2 On more rapidly, and making its output potential and current rise faster.

The capacitor 12 and resistor 11 in the input of transistor 1 act as a differentiating circuit to provide a sharply peaked input pulse at the base 1*b*.

The capacitor 6 supplies practically all the base current for the transistor 2, none of it being supplied by battery 10, so that none of it appears in the load resistor 17. Consequently, the output potential across resistor 17 is very little affected by changes in the characteristics of the transistor 2.

While the resistor 15 is sometimes termed herein a balancing resistor, to distinguish it from other resistors in the circuit, and while it is shown as being equal to resistor 17 in resistance, that equality is not a necessary condition for operation of the circuit.

FIG. 2

Figure 2:
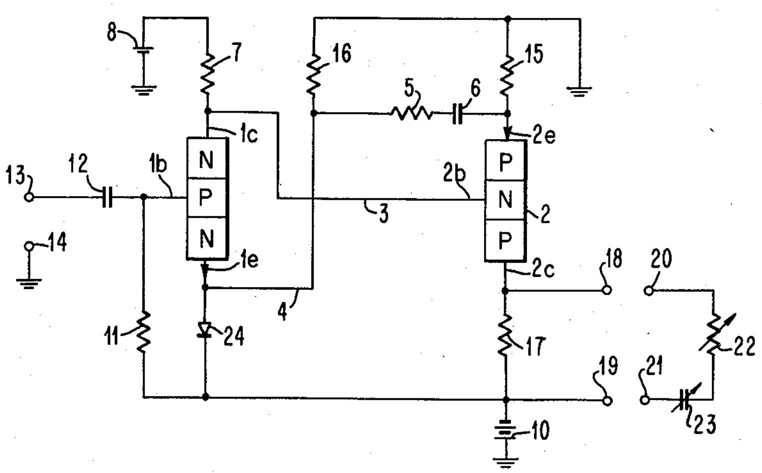
Fig. 2 is a wiring diagram of a modification.

This figure illustrates a modification of the circuit of transistor 1, which is designed to operate at faster pulse rates. The circuit of Fig. 2 is the same as that of Fig. 1, except that the resistor 9 of Fig. 1 has been replaced by a diode 24. The other elements in the circuit of Fig. 2 have been given the same reference numerals as their counterparts in Fig. 1, and will not be further described.

The use of the diode 24 in Fig. 2 allows the capacitor 6 to charge more rapidly than was the case in the circuit of Fig. 1. Consequently, the circuit of Fig. 2 can handle more rapid pulse rates. When the capacitor 6 is discharging, the diode 24 is reversely biased, and hence does not affect the duration of the output signals.

The circuit of Fig. 2 does not give as good output wave forms as the circuit of Fig. 1, but is to be preferred where higher pulse rates are required.

FIG. 3

Figure 3:
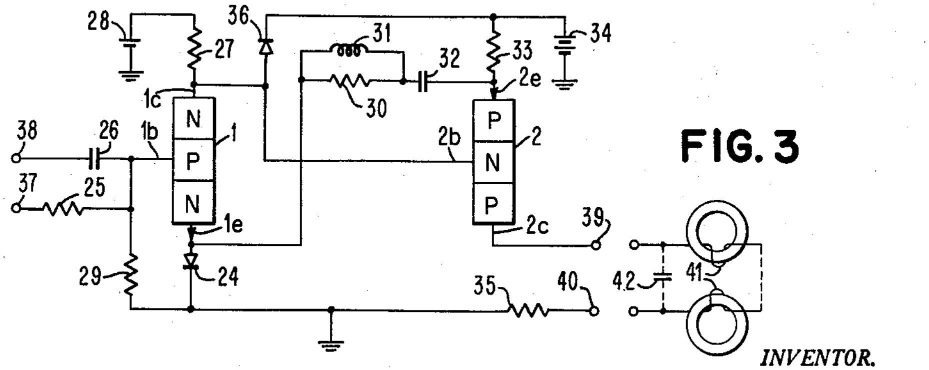
Fig. 3 is a wiring diagram of another modification.

This circuit is similar to the circuits previously described and has been modified to provide higher current output pulses. This circuit may be termed a current driver as opposed to the circuits of Figs. 1 and 2, which are voltage drivers. Those elements in Fig. 3 which are the same as their counterparts in Figs. 1 and 2 have been given the same reference numerals, and will not be further described. However, most of the impedance elements have had their values changed from the circuit of Fig. 1, so that those elements have been given different reference numerals. The values of the impedance elements and battery potentials in Fig. 3 are set forth in the table below:

*Table*

| | | |
|---|---|---|
| Resistor 25 | ohms | 10,000 |
| Capacitor 26 | do | 470 |
| Resistor 27 | do | 1,000 |
| Battery 28 | volts | 12 |
| Resistor 29 | ohms | 10,000 |
| Resistor 30 | do | 47 |
| Inductance 31 | mh | 50 |
| Capacitor 32 | pfd | 20K |
| Resistor 33 | ohms | 20,000 |
| Battery 34 | volts | 9 |
| Resistor 35 | ohms | 18 |

The resistor 16 of Figs. 1 and 2 is replaced by diode 36. The input signal is supplied through a terminal 38, connected through capacitor 26 to base 1*b*. A gating input terminal 37 is connected through resistor 25 to base 1*b*. This terminal 37 may be connected to a source of potential shiftable between one value which is effective to bias the transistor 1 Off, i.e., to close the gate, and another potential at which the signals at input terminal 38 control the transistor, i.e., the gate is open.

Output terminals 39 and 40 are now connected in series with the load resistor 35 instead of in parallel. The external load is illustrated diagrammatically as comprising a plurality of series connected windings 41 on magnetic cores. Distributed capacitance is indicated at 42.

The inductance 31 is provided to smooth the discharge current of the capacitor 32. Without the inductance, the capacitor tends to discharge a large current initially which trails off to a lower value. The inductance 31 has the effect of reducing the initial discharge current and prolong its maximum value so as to produce a more nearly square wave output from the transistor 1.

The diode 36 is provided to protect the base-collector impedance of the transistor 2 and the emitter-collector impedance of transistor 1, against excessive reverse voltages applied between ground and the interconnected base 2*b* and collector 1*c*.

While I have shown and described certain preferred embodiments of my invention, other modifications thereof will readily occur to those skilled in the art, and I therefore intend by invention to be limited only by the appended claims.

Any of the circuits shown may be modified by substituting an NPN transistor for the PNP transistor, and a PNP transistor for the NPN transistor. If so modified, the diode and battery polarities must be reversed from those shown.

I claim:

1. A single shot bistable circuit comprising first and second transistors having complementary symmetry, each of said transistors having a base electrode, an emitter electrode, and a collector electrode, a direct conductive connection between the collector of the first transistor and the base of the second transistor, a resistor and a capacitor connected in series between the emitters of the transistors, circuit means connected between the bases and emitters of the respective transistors and tending to hold said transistors Off, means effective when both transistors are Off to charge said capacitor, signal input means connected to the base of the first transistor to supply to said base an input signal effective to turn said first transistor On, said transistors then cooperating with said connection and said resistor and capacitor to turn said second transistor On and to establish a discharge circuit for said capacitor including both said transistors, said capacitor and resistor being effective to overcome said circuit means and hold said transistors On for a predetermined time, said circuit means being effective when said capacitor is discharged to turn said transistors Off, and signal output means connected to the collector of the second transistor.

2. A single shot bistable circuit as defined in claim 1, in which said signal input means comprises a differentiating network to reduce the rise time of the single shot.

3. A single shot bistable circuit as defined in claim 1, in which said signal output means comprises a load resistor connected in series with the collector of the second transistor, and including a balancing resistor connected in series with the emitter of the second transistor, and a source of direct electric energy connected to supply current through a series circuit including said load resistor, said balancing resistor and the emitter-collector impedance of the second transistor, said resistors dividing the potential of the source, and means for applying a capacitive external load across said load resistor, so that an increase in the capacitive external load causes an increase in the potential across said balancing resistor and hence an increased discharge of current from said capacitor.

4. A single shot bistable circuit as defined in claim 1, including an inductance connected in parallel with said resistor and effective to smooth the discharge current flowing from said capacitor.

5. A single shot bistable circuit as defined in claim 1, including a diode connected between the emitter of the first transistor and a source of potential, said diode forming a part of the capacitor charging means and being reverse biased when said capacitor discharges.

6. A single shot bistable circuit as defined in claim 1, including a diode connected between the base of the second transistor and one terminal of the supply source, said diode being poled to limit the reverse potential which may be applied across the base-collector impedance of that transistor and across the emitter-collector impedance of the first transistor.

7. A single shot bistable circuit comprising a transistor, having an emitter electrode, a base electrode, and a collector electrode, means biasing the transistor Off; means for supplying base current for said transistor including a capacitor, impedance means, and means connecting the capacitor and the impedance means in series with the emitter electrode; charging circuit means operable to charge said capacitor while the transistor is Off, means for overcoming the biasing means to turn the transistor On, a discharge circuit for the capacitor including in series the base-emitter impedance of the transistor, said discharge circuit being effective to maintain the transistor On for a time determined by the time constant of said capacitor and said impedance means, and output means connected to the collector electrode.

8. A single shot bistable circuit as defined in claim 7, in which the output means includes a load resistor connected in series with the collector of the transistor, said circuit also including a balancing resistor connected in series with the emitter, and a source of direct electric energy connected to supply current through a series circuit including said load resistor, said balancing resistor and the emitter-collector impedance of the second transistor, said resistors dividing the potential of the source, and means for applying an external capacitive load across said load resistor, so that an increase in the external load causes an increase in the potential across said balancing resistor and hence an increased discharge of current from said capacitor.

References Cited in the file of this patent

UNITED STATES PATENTS 2,641,717 Toth ---------------- June 9, 1953

2,810,831 Jakielski ---------------- Oct. 22, 1957